United States Patent
Ogino et al.

(10) Patent No.: US 8,644,665 B2
(45) Date of Patent: Feb. 4, 2014

(54) SEMICONDUCTOR MANUFACTURING APPARATUS

(75) Inventors: Yoshiaki Ogino, Nakai-machi (JP); Katsumi Kimura, Nakai-machi (JP); Yasuhiro Iida, Nakai-machi (JP); Kazuhiro Soga, Nakai-machi (JP)

(73) Assignee: Hitachi Information & Telecommunication Engineering, Ltd., Yokohama-shi, Kanagawa-ken (JP)

( * ) Notice: Subject to any disclaimer, the term of this patent is extended or adjusted under 35 U.S.C. 154(b) by 401 days.

(21) Appl. No.: 13/059,297

(22) PCT Filed: Sep. 29, 2008

(86) PCT No.: PCT/JP2008/067684
§ 371 (c)(1),
(2), (4) Date: Feb. 16, 2011

(87) PCT Pub. No.: WO2010/035348
PCT Pub. Date: Apr. 1, 2010

(65) Prior Publication Data
US 2011/0140007 A1 Jun. 16, 2011

(51) Int. Cl.
*H01S 3/30* (2006.01)
*G02B 6/10* (2006.01)
*G02B 6/036* (2006.01)

(52) U.S. Cl.
USPC ............... 385/126; 372/6; 385/129; 385/146

(58) Field of Classification Search
USPC ............... 385/126, 129, 146; 372/6
See application file for complete search history.

(56) References Cited

FOREIGN PATENT DOCUMENTS

| | | |
|---|---|---|
| JP | 01-211911 A | 8/1989 |
| JP | 2004-063879 A | 2/2004 |
| JP | 2004-064066 A | 2/2004 |
| JP | 2004-153150 A | 5/2004 |
| JP | 2004-349635 A | 9/2004 |
| JP | 2005-217213 A | 8/2005 |
| JP | 2005217213 A | 8/2005 |
| JP | 2005333150 A | 12/2005 |
| JP | 2007-115729 A | 5/2007 |
| JP | 2007115729 A | 5/2007 |
| WO | 2007114031 A1 | 10/2007 |

*Primary Examiner* — Ryan Lepisto
*Assistant Examiner* — Erin Chiem
(74) *Attorney, Agent, or Firm* — Bacon & Thomas, PLLC

(57) ABSTRACT

To project a rectangular laser spot having a predetermined size and a high laser power density onto the surface of an object, a semiconductor manufacturing apparatus comprises a control unit for controlling power of a laser light source, an optical waveguide unit (1) including a core section (10) transmitting laser light and a clad section (11) covering the core section (10), and a lens (3) for forming the laser light output through the optical waveguide unit (1) into a laser spot having a predetermined shape, an output end surface (15) of the core section (10) has a rectangular shape with one side length of 1 μm to 20 μm and the other side length of 1 mm to 60 mm, and the laser source is set to make the power density of the laser spot output from the core section (10) to be 0.1 mW/μm² or more.

14 Claims, 5 Drawing Sheets

DISPLAY

MOTHER GLASS

SEMICONDUCTOR MANUFACTURING APPARATUS

CROSS-REFERENCE TO RELATED APPLICATIONS

This is a national stage of the International Application No. PCT/JP2008/067684 filed on Sep. 29, 2008 and published in Japanese language.

BACKGROUND OF THE INVENTION

1. Field of the Invention

The present invention relates to a semiconductor manufacturing apparatus, which manufactures flat displays of liquid crystal, organic electro-luminescence (EL) and the like by irradiating an object with laser light to change physical property of the object. More specifically, the present invention relates to a semiconductor manufacturing apparatus which as suitable for a flat display manufacturing system irradiating amorphous silicon or polysilicon formed on an insulating board with laser light to change physical property of a silicon film.

2. Description of the Conventional Art

A display apparatus in recent years has used a liquid crystal element as a display element. The liquid crystal element (a pixel element) or a driver circuit of the liquid crystal element is configured with a thin film transistor (hereinafter referred to as TFT). In a manufacturing procedure of the TFT, a step to modify amorphous silicon formed on a glass substrate to polysilicon is required. In this connection, "changing physical property of an object" is called "modification" in the present specification, and the modification includes not only changing amorphous silicon to polysilicon but also changing physical property of a material.

The modification process is to modify a silicon film by laser irradiation. As illustrated in FIG. 10, the modification step includes a process for forming an undercoat film ($SiO_2$) 73 on an insulating substrate 72 of quartz glass or alkali-free glass, where the undercoat film 73 prevents entering of impurities from the insulating substrate 72; a process for forming an amorphous silicon film surface 74 on the undercoat film 73; a process to irradiate the amorphous silicon film surface 74 with a linear laser beam 75 by using a high-output laser as a light source; a process for modifying amorphous silicon to a polysilicon 74B by scanning the linear laser beam 75 in a lateral direction 74A; a process for cutting out polysilicon only at a position in which the TFT is configured; a process for forming an gate oxide film ($SiO_2$) on the cut-out and attaching a gate electrode at an uppermost part; a process for injecting predetermined impurity ions into the oxide film ($SiO_2$) and forming a source/drain; and a process for erecting aluminum electrodes on the source/drain, covering the whole with a protection film, and making the TFT In addition, SiN or SiON can be sandwiched between the insulating substrate 72 and the undercoat film 73.

In the aforementioned modification process of a silicon film by laser irradiation, excimer laser annealing by an excimer laser is generally used. In the excimer laser annealing, a polysilicon film is formed by irradiating a silicon film with a XeCl excimer laser having a wavelength of 307 nm and a pulse width of several-ten nanoseconds, which has high light absorptivity, injecting comparatively low energy of 160 $mJ/cm^2$, and quickly heating up the silicon film to a melting point. The above excimer laser has features that it has a large output of several-hundred watts, can form the large linear laser spot having a larger length than one side of a rectangular mother glass, and can collectively and efficiently modify the whole surface of the silicon film formed on the mother glass. In the modification of silicon by the excimer laser, since the crystal grain size of polysilicon, which strongly affects the performance of the TFT, is as small as 100 nm to 500 nm, an electric field effect mobility which is an index of the TFT performance can be made to be about 150 $cm^2/V\cdot s$.

In recent years, a system-on-glass has been proposed and partially realized, where the system-on-glass includes high performance circuits such as a control circuit, an interface circuit, an arithmetic circuit and the like, in addition to the pixel element on the flat display and the driver circuit. The TFT of the system-on-glass is required to have high performance, and is required to be modified into polysilicon with high quality (having large crystal grains). The patent document 1 listed below describes a technique related to the modification into polysilicon modification with high quality. The patent document 1 discusses that an amorphous silicon film with high quality having large crystal grains long in the scanning direction is formed by using a solid state laser for exciting a semiconductor as a light source, continuously emitting light (CW) from the laser, and scanning a laser beam irradiated on a silicon film. Furthermore, the patent document 1 discusses that a high performance TFT having an electric field effect mobility of 300 $cm^2/V\cdot s$ or more is formed by previously patterning amorphous silicon in a ribbon shape or an island shape at a position where the high performance TFT is required.

In the excimer laser annealing and the solid-state laser annealing, it is desired that power density of the laser spot irradiated and formed on the silicon film surface is comparatively high and spatial laser strength distribution is uniform. One reason why these are desired is that, in the modification procedure including crystals of the silicon film, it is necessary to inject energy capable of performing the modification in a short time (several-ten ns to several-ten μs) before heat is transferred to a laminated film adjacent to the silicon film. In addition, another reason is to avoid spatial strength unevenness of the laser strength distribution, which affects modification spots directly.

The patent document 2 listed below discusses a technique of a method for shaping a strength distribution of an excimer laser light. According to a beam homogenizer (an optical module for equalizing a profile of laser light on an irradiation surface) described in the patent document 2, a lens group consisting of a cylindrical lens, a fly-eye lens, and the like is arranged at a later stage of excimer laser output, and a desired spot shape and laser strength distribution on the silicon film surface are finally obtained.

Furthermore, the patent document 3 listed below discusses a technique for condensing laser light output from a plurality of low output solid-state lasers at one position by optical fibers, and irradiating a silicon film with the condensed laser light through an optical waveguide unit. The patent document 3 discusses that laser light irradiated from a plurality of laser light-emitting elements is condensed by using an optical fiber body, and the condensed laser light is branched and irradiated into a plurality of branch passages by using the optical waveguide unit.

Patent Document 1: Japanese Patent Application Laid-Open No. 2003-86505
Patent Document 2: Japanese Patent Application Laid-Open No. H9-129573
Patent Document 3: Japanese Patent Application Laid-Open No. 2007-88050

SUMMARY OF THE INVENTION

Problems to be Solved by the Invention

In the technique disclosed in the patent document 2, the beam homogenizer is configured with a lot of optical members such as a cylindrical lens, a fly-eye lens, a beam expander, a slit, and the like. Thus, there is a problem that the configuration is very complicated, including arrangements of each optical member. Further, the technique disclosed in the patent document 3 is to irradiate the silicon film with laser light, which is dividedly output and diffused from an output surface of the optical waveguide unit. Thus, the patent document 3 does not disclose controlling of a laser spot shape formed on the silicon film, laser strength distribution, and a laser power density, and there is a problem that it is difficult to properly control a laser spot shape and a laser power density with respect to an object. Furthermore, the patent document 3 does not disclose a means for monitoring and maintenancing the laser spot shape formed on the silicon film.

An objective of the present invention is to provide a semiconductor manufacturing apparatus capable of realizing on the surface of an object, a comparatively simplified configuration and arrangement of a rectangular laser spot having a predetermined size, a comparatively high laser power density and a top-flat laser strength distribution, and modifying the surface of the object with the laser spot.

Means for Solving the Problem

According to a first aspect of the present invention to realize the above-described objective, a semiconductor manufacturing apparatus includes a laser light source for light-emitting laser light; a control unit for controlling laser power of the laser light source; an optical waveguide unit including a core section for transmitting the laser light and a clad section for covering the core section; and a lens for forming the laser light output from an output end surface of the optical waveguide unit into a laser spot having a predetermined shape. The optical waveguide unit guides the laser light to the output end surface from an input end surface by a difference in refractive index between the core section and the clad section, irradiates an object with the laser spot formed by the lens, and thereby modifies the surface of the object.

The optical waveguide unit has, on the output end surface, the core section having a rectangular cross-sectional shape whose one side has a length of 1 µm to 20 µm and another side orthogonal to the one side has a length of 1 mm to 60 mm.

The control unit sets a value of the laser power of the laser light source so that the power density of the laser spot output from the output end surface of the core section is 0.1 mW/µm$^2$ or more.

According to a second aspect of the present invention, a semiconductor manufacturing apparatus includes a laser light source for light-emitting laser light; a control unit for controlling laser power of the laser light source; an optical waveguide unit including a core section for transmitting the laser light and a clad section for covering the core section; and a lens for forming the laser light output from an output end surface of the optical waveguide unit into a laser spot having a predetermined shape. The optical waveguide unit guides the laser light to the output end surface from an input end surface by a difference in refractive index between the core section and the clad section, and irradiates an object with the laser spot formed by the lens, to thereby modify the surface of the object.

The optical waveguide unit has, on the output end surface, the core section having an elongated elliptical cross-sectional shape whose lateral width has a length of 1 µm to 20 µm and longitudinal width has a length of 1 mm to 60 mm.

The control unit sets a value of the laser power of the laser light source so that the power density of the laser spot output from the output end surface of the core section is 0.1 mW/µm$^2$ or more.

Further, according to a third aspect of the present invention, in the semiconductor manufacturing apparatus having the first or second aspect, a PV ratio calculated by a formula (P−V)/P×100% is 20% or less, where P is a maximum value of a strength distribution of the laser spot output from the output end surface of the core section, and V is a minimum value of the strength distribution.

Further, according to a fourth aspect of the present invention, in the semiconductor manufacturing apparatus having the 1st or 2nd aspect, a variable aperture to narrow a width of the laser light output from the output end surface is provided between the output end surface of the optical waveguide unit and the lens.

Further, according to a fifth aspect of the present invention, in the semiconductor manufacturing apparatus having the fourth aspect, a PV ratio calculated by a formula of (P−V)/P×100% is 20% or less, where P is a maximum value of a strength distribution of the laser spot output from the output end surface of the core section, and V is a minimum value of the strength distribution.

Further, according to a sixth aspect of the present invention, a semiconductor manufacturing apparatus includes laser light source for light-emitting laser light; a control unit for controlling laser power of the laser light source; an optical waveguide unit including a plurality of core sections for transmitting the laser light and a clad section for covering the core sections; a lens for forming the laser light output from an output end surface of the optical waveguide unit into a laser spot having a predetermined shape; and a focus controlling unit for controlling a focus of the laser spot. The optical waveguide unit guides the laser light to the output end surface from an input end surface by a difference in refractive index between the core sections and the clad section, and irradiates an object with the laser spot formed by the lens, while focus-controlling the laser spot, and thereby modifies the surface of the object.

The optical waveguide unit has, on the output end surface, a main core section having a rectangular cross sectional shape whose one side has a length of 1 µm to 20 µm and other side orthogonal to the one side has a length of 1 mm to 60 mm, and a plurality of sub-core sections arranged around the main core section to output laser light for controlling a focus.

The control unit sets a value of the laser power of the laser light source so that a power density of the laser spot output from the main core section is 0.1 mW/µm$^2$ or more.

The focus control unit controls the focus based on reflection light of the laser light output from the sub-core sections.

Further, according to a seventh aspect of the present invention, a semiconductor manufacturing apparatus includes a laser light source for light-emitting laser light; a control unit for controlling laser power of the laser light source; an optical waveguide unit including a plurality of core sections for transmitting the laser light and a clad section for covering the core sections; a lens for forming the laser light output from an output end surface of the optical waveguide unit into a laser spot having a predetermined shape; and a focus controlling unit for controlling a focus of the laser spot. The optical waveguide unit guides the laser light to the output end surface from an input end surface by a difference in refractive index between the core sections and the clad section, and irradiates an object with the laser spot formed by the lens, while focus-controlling the laser spot, and thereby modify the surface of the object.

The optical waveguide unit has, on the output end surface, a main core section having an elongated elliptical cross-sectional shape whose lateral width is 1 µm to 20 µm and longitudinal width is 1 mm to 60 mm, and a plurality of sub-core sections arranged around the main core section to output laser light for controlling a focus.

The control unit sets a value of the laser power of the laser light source so that a power density of the laser spot output from the main core section is 0.1 mW/µm² or more.

The focus control unit controls the focus based on reflection light of the laser light output from the sub-core sections.

Further, according to an eighth aspect of the present invention, in the semiconductor manufacturing apparatus having the sixth or seventh aspect, a PV ratio calculated by a formula of (P−V)/P×100% is 20% or less, where P is a maximum value of a strength distribution of the laser spot output from the output end surface of the main core section and V is a minimum value of the strength distribution.

Further, according to a ninth aspect of the present invention, in the semiconductor manufacturing apparatus having the sixth or seventh aspect, a variable aperture to narrow a width of the laser light output from the output end surface is provided between the output end surface of the optical waveguide unit and the lens.

Further, according to a tenth aspect of the present invention, in the semiconductor manufacturing apparatus having the eighth aspect, a variable aperture to narrow a width of the laser light output from the output end surface is provided between the output end surface of the optical waveguide unit and the lens.

Further, according to an eleventh aspect of the present invention, in the semiconductor manufacturing apparatus having the sixth or seventh aspect, the focus control unit controls the focus so that a reflected laser spot of the sub-core sections projected by reflection light of the laser light output from the sub-core sections has a predetermined size.

Further, according to a twelfth aspect of the present invention, in the semiconductor manufacturing apparatus having the eighth aspect, the focus control unit controls the focus so that reflected laser spots of the sub-core sections projected by reflection light of the laser light output from the sub-core sections have a predetermined size.

Further, according to a thirteenth aspect of the present invention, in the semiconductor manufacturing apparatus having the ninth aspect, the focus control unit controls the focus so that reflected laser spots of the sub-core sections projected by reflection light of the laser light output from the sub-core sections have a predetermined size.

Furthermore, according to a fourteenth aspect of the present invention, in the semiconductor manufacturing apparatus having the tenth aspect, the focus control unit controls the focus so that reflected laser spots of the sub-core sections projected by reflection light of the laser light output from the sub-core sections have a predetermined size.

Effect of the Invention

The semiconductor manufacturing apparatus according to the present invention transmits the laser light output from the laser light source, by using the optical waveguide unit including the core section and the clad section for covering the core section, and can irradiate a surface of an object with the laser spot through a simple structure by making the size of the core section to be a predetermined size, and controlling the laser power of the laser light source, wherein the laser spot has a rectangular cross sectional shape or the elongated elliptical cross sectional shape having a predetermined size and has a high density laser power. Further, the semiconductor manufacturing apparatus according to the present invention includes, in the optical waveguide unit, the sub-core sections for transmitting the laser light for controlling the focus of the laser spot, so that the apparatus can control the focus through a simple structure.

DETAILED DESCRIPTION OF PREFERRED EMBODIMENT

A semiconductor manufacturing apparatus according an exemplary embodiment of the present invention will be described in detail below with reference to the drawings.

Figure 3:
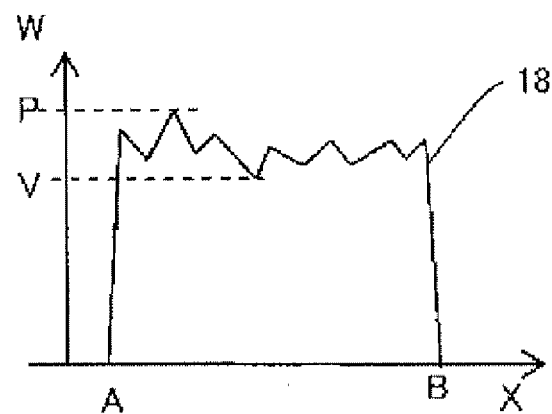
FIG. 3 illustrates a laser strength distribution output from an output end surface of an optical waveguide unit.

In addition, coordinates X, Y, and Z are commonly used in all the drawings attached with the specification of the present invention. Laser light coming from a plurality of laser light-emitting elements is formed to be a laser spot having a desired spot shape by using a lens group of. For example, a laser spot is formed in an elongated elliptical shape extending in the X direction. Uniformity of a spatial laser strength distribution of the laser spot is called a PV ratio. As illustrated in FIG. 3, the PV ratio is defined with a formula of PV ratio=(P−V)/P×100%, where P is a maximum value of the laser strength distribution and V is a minimum value of the laser strength distribution.

First Exemplary Embodiment

Figure 1:
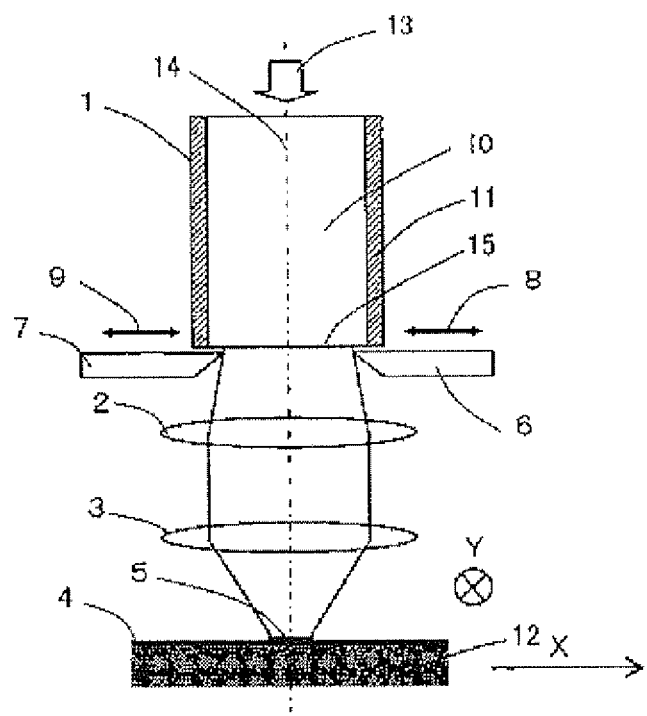
FIG. 1 illustrates a configuration of a semiconductor manufacturing apparatus according to one exemplary embodiment of the present invention.

As illustrated in FIG. 1, a semiconductor manufacturing apparatus according to one exemplary embodiment of the present invention includes a plurality of laser light sources (not illustrated) for irradiating laser lights; an optical waveguide unit 1 for inputting multi-sourced laser light irradiated from a plurality of the laser light sources and outputting it; variable apertures 6 and 7 moving in the directions of arrows 8 and 9 for narrowing a width of the laser light output from the optical waveguide unit 1; a collimate lens 2 for inputting the laser light passing through the variable apertures 6 and 7 and polarizing the laser light to parallel laser light; and an objective lens 3 for narrowing the parallel laser light to focus the parallel laser light output from the collimate lens 2.

The optical waveguide unit 1 is configured with a core section 10 having a predetermined refractive index and a clad section for covering a circumference of the core section 10. The clad section has a different refractive index from that of the core section 10. The optical waveguide unit 1 entirely reflects the laser lights input into the core section 10 on a boundary surface with the clad section 11 having the different refractive index, confines the laser light in the core section 10, and guides the laser light to a predetermined transmission direction. The optical waveguide unit 1 has also a function of repeating the reflection of the laser light two or more times in the core section 10 and smoothing a laser light spatial strength distribution on a surface orthogonally to an optical axis direction 14.

Figure 2:
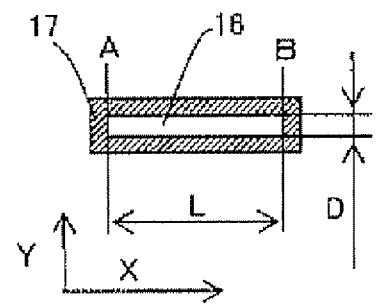
FIG. 2 illustrates an output end surface of an optical waveguide unit according to the present exemplary embodiment.

A detailed configuration of the optical waveguide unit 1 is illustrated in FIG. 2 where an output end surface 15 of the optical waveguide unit 1 is seen in the optical axis direction 14 in FIG. 1. As illustrated in FIG. 2, the optical waveguide unit 1 is configured with a clad section 17 having a square-framed cylindrical shape shown by an obliquely hatched region, and a core section 16 having a different refractive index from the clad section 17 and reflecting and passing the laser light on a boundary surface with the clad section 17. The core section 16 is formed in a long rectangular cross sectional shape having a length L and width D. When a longitudinal direction of the core section is an X direction, the X direction coincides with the X direction in FIG. 1.

Then, a laser optical path by a semiconductor manufacturing apparatus according to present exemplary embodiment will be described with reference to FIG. 1. The present apparatus inputs laser light 13 output from the laser light source to the core section 10 of the optical waveguide unit 1, and transmits it through the inside of the core section to without the occurrence of absorption loss, while entirely reflecting the laser light 13 input into the optical wavelength unit 1 on a boundary with the clad section 11. Accordingly, the present apparatus smoothes a spatial laser strength distribution in a surface orthogonal to the optical axis direction 14, and outputs the laser light from an output end surface 15. Furthermore, the present apparatus narrows the output laser light to have a predetermined width, by using the variable apertures 6 and 7, and polarizes the laser light to be parallel light, by using the collimate lens 2. Then, the present apparatus forms an image so as to focus a laser spot 5 having a predetermined size on the surface of an objective 4 with a predetermined magnification ratio, by using the objective lens 3.

As for the laser light 13 input into the core section 10 of the optical waveguide 1, the laser light 13 can be input into the core section 10 after being narrowed by a lens not illustrated, or laser light 13 from the laser light source placed at a distant position can be transmitted by using an optical fiber so as to be input to the core section 10. Further, the number of the laser light source can be two or more, and the required number of laser light sources can be placed. Furthermore, a plurality of optical fibers can be arranged in parallel so that output sections of the plurality of optical fibers are directly connected to the core section 10 of the optical waveguide unit 1, to thereby directly input the laser light output from the output sections of the plurality of optical fibers to the core section 10 of the optical waveguide unit 1.

Further, a length in the optical axis direction 14 of the optical waveguide unit 1 is determined so that the PV ratio is 20% or less on the output end surface 15 of the optical waveguide unit 1. An output width in the X direction of the laser light passing through the output end surface 15 of the optical waveguide unit 1 is controlled by the variable apertures 6 and 7.

FIG. 3 illustrates a laser strength distribution output from the output end surface 15 of the optical waveguide unit 1. As clearly seen in FIG. 3, both ends A and B of a laser strength distribution 18 on a lateral axis X correspond to the positions of A and B in FIG. 2, and it is steep at the both ends of the laser spot and has a top-flat shape having some irregularities.

As described above, the size of the laser spot 5 formed on the object surface 4 by the semiconductor manufacturing apparatus of the present exemplary embodiment is a size obtained by similarly reducing the size (length L×width D) of the output end surface 15 of the optical waveguide unit 1 according to a magnification of the objective lens. The spatial strength distribution of the laser spot 5 formed on the object surface 4 coincides with the laser strength distribution 18 output from the output end surface 15 of the optical waveguide unit 1. Therefore, the semiconductor manufacturing apparatus according to the present exemplary embodiment passes the laser light through the optical waveguide unit 1 having the rectangular cross sectional shape and thereby forms the laser spot having a rectangular irradiation surface. Accordingly, the semiconductor manufacturing apparatus can modify the object by using thus formed laser spot.

In the semiconductor manufacturing apparatus according to the present exemplary embodiment, for growing an object, e.g., amorphous silicon having about 50 nm thickness, to polysilicon, the laser spot 5 can be scanned relatively in the Y direction. At a practical scanning speed of 100 mm/s or more, a width in the scanning direction of the laser spot is properly 20 µm or less, and a laser power density is desirably 0.1 mW/µm$^2$ or more. Under these conditions, a wavelength of a laser of the semiconductor manufacturing apparatus for modifying the object is properly, for example, 370 nm to 480 nm which is a range to obtain absorption of amorphous silicon. For obtaining uniform polysilicon, it is desirable that a PV ratio of the laser strength distribution in the longitudinal direction (X direction) of the laser spot 5 is 20% or less. The reason why the above PV ratio is desirable is that unevenness in a crystal size and local coagulation and sublimation are caused easily when the PV ratio is 20% or more.

Further, when the magnification of the objective lens 3 in the apparatus is 1 time, it is good that the lateral core width D of the optical waveguide unit 1 is 20 µm or less, and the longitudinal core width L is 1 mm or more. Further, it is good that the laser power density in the output end surface 15 of the optical waveguide unit 1 is 0.1 mW/µm$^2$ or more. Furthermore, it is good that the PV ratio in the laser strength distribution of the output end surface 15 of the optical waveguide unit 1 is 20% or less. When the magnification of the objective lens is increased, the above-described laser spot conditions on the object surface can be easily satisfied.

The above-described exemplary embodiment describes an example that the collimate lens 2 and the objective lens 3 similarly reduce the output end surface 15 of the optical waveguide unit 1 and performs condensing and projecting of light on the object. However, the present invention is not limited to the example. A lens having such an aspect ratio of the output end surface of the optical waveguide unit that is set to a predetermined magnification, can be used to form the laser spot having an arbitrary aspect ratio on the surface of the object. For example, the output section of the core section of the optical waveguide unit according to the present invention can have one side length of 1 µm to 20 µm and another side length of 1 mm to 60 mm which is orthogonal to the one side.

Second Exemplary Embodiment

Then, a configuration of a semiconductor manufacturing apparatus using a composite optical waveguide unit according to another exemplary embodiment will be described with reference to FIG. 4. The semiconductor manufacturing apparatus according to the present exemplary embodiment is configured with a laser light source (not illustrated) which is similar to that of the above-described first exemplary embodiment; a composite optical waveguide unit 19 characterized in the second exemplary embodiment; a collimate lens 23; a beam splitter 24 for transmitting laser light output from the composite optical waveguide unit 19 and reflecting the laser light reflected from an object 37 to the orthogonal direction; an objective lens 25; a light-condensing lens 28; a focus detector 29 for receiving the laser light reflected by the beam splitter and converting the laser light to electric signals; and arithmetic elements 30 to 32 for outputting focus error signals 33A to 33F based on the electric signals output from the focus detector 29.

Figure 4:
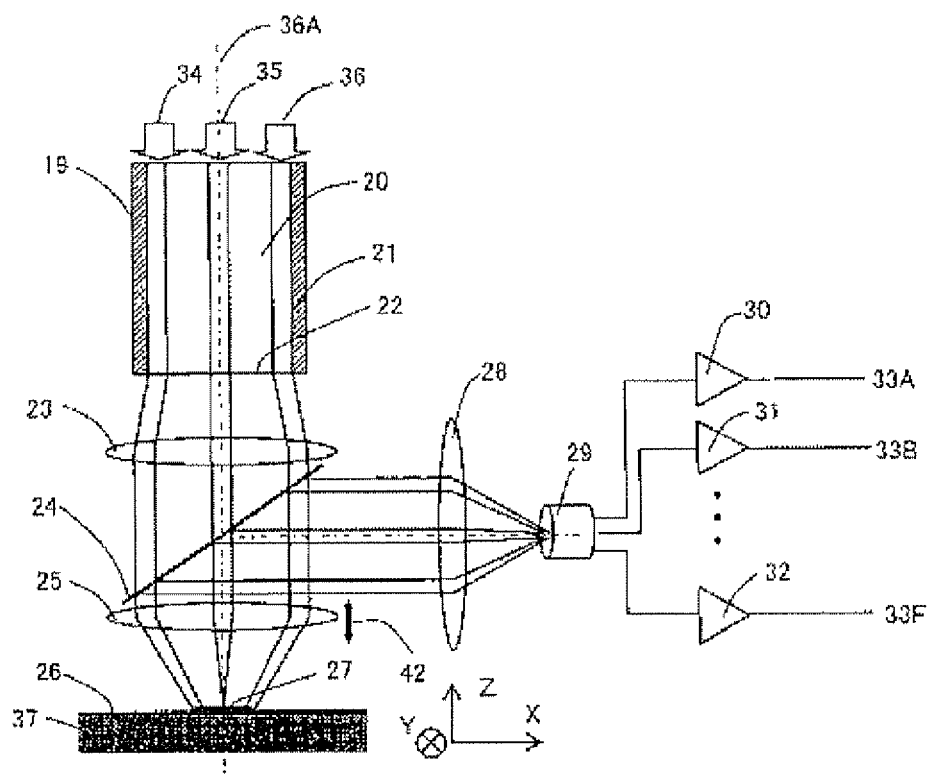
FIG. 4 illustrates a configuration of a semiconductor manufacturing apparatus according to another exemplary embodiment of the present invention.
Figure 5:
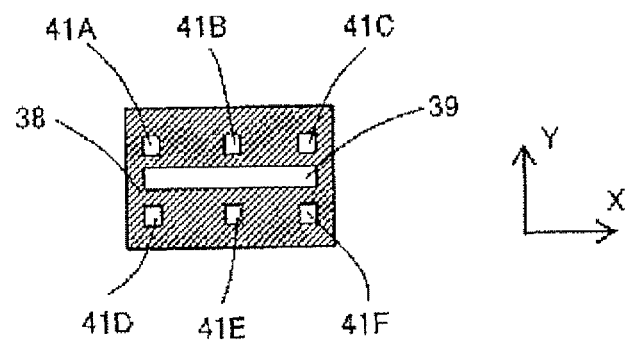
FIG. 5 illustrates an output end surface of a composite optical waveguide unit according to another exemplary embodiment.

As illustrated in FIG. 5, where an output end surface 22 of the composite optical waveguide unit 19 in FIG. 4 is seen along an optical axis 36A, the above-described composite optical waveguide unit 19 includes a common clad section 38 (an obliquely hatched part) having a rectangular cross sectional shape, and a plurality of core sections arranged in the clad section 38, where the core sections are to reflect laser light by a difference in refractive index between the clad section 38 and the core sections. The core sections include a rectangular core section 39 (corresponding to the main core section) at a center thereof, and small core sections 41A to 41F (corresponding to the sub-core sections), which are arranged three by three symmetrically around the rectangular core section 39. These clad section and seven core sections are cut in depth directions along the direction of the optical axis 36A, and have sizes and shapes similar to those of the output surface also in a laser light input surface. The composite optical waveguide unit 19 according to the present exemplary embodiment having such the configuration totally reflects the laser light input to the core sections on boundaries with the clad section, transmits the laser light without absorption loss, and passes the laser light, which is transmitted through each core section, in each core section without mutual interference of the laser light. An output end surface of each core section is orthogonal to the optical axis 36A, and the output end surface of each core is arranged precisely on one plane.

Particularly, the apparatus according to the present exemplary embodiment utilizes the laser light passing through the core section 39 as laser light to modify the object 37, and utilizes the laser light passing through the small core sections 41A to 41F as laser light to detect a size of a laser spot 27.

Then, a laser optical path of the semiconductor manufacturing apparatus according to the present exemplary embodiment will be described. The present apparatus inputs laser light 34 to 36 output from a plurality of light source to the core section 39 and the plural small core sections 41A to 41F, and the optical waveguide unit 19, to which the laser light 34 to 36 is input, transmits it through the insides of the core section 39 and the plural small core sections 41A to 41F without the occurrence of absorption loss. The passed laser light smoothes the spatial laser strength distribution in the surface orthogonal to crossing optical axis 36A, and is output from the output end surface 22. The output laser light passes through the collimate lens 23 and the beam splitter 24, and enter into the objective lens 25. The laser light, which is strongly condensed by the objective lens 25 is focused so as to form an image of the laser spot 27 having such a predetermined size as to correspond to the output end surface 22 on the object surface 26 of the object 37.

Then, in the semiconductor manufacturing apparatus, the beam splitter 24 orthogonally reflects reflection light of the laser spot 27 image-formed on the object surface 26 of the object 37, and the focus detector 29 receives the reflection light through the lens 28. The focus detector 29 generates focus error signals 33A to 33F corresponding to the laser spots of the respective small core sections 41A to 41F, and the semiconductor manufacturing apparatus performs feedback control so that the focus error signals 33A to 33F come to be zero, to thereby control the laser light to be in the most narrowed state (a focusing state) on the object surface 26 of the object 37.

The semiconductor manufacturing apparatus with the composite optical waveguide 19 according to the present exemplary embodiment detects the change of the laser spot size with levels of the focus error signals, by utilizing features that the laser spot 27 has a larger laser spot size at a time of out-of-focus than that at a time of focusing on the object surface 26 of the object 37. More specifically, the semiconductor manufacturing apparatus can perform autofocus control, in which the object lens 25 is controlled to move in an optical axis direction (Z direction), by utilizing one or more focus error signals based on the reflection light of the laser light passing through the above-described six small core sections 41A to 41F. By performing the autofocus control, a stable spot size can be kept against the fluctuation (in the Z direction) of the object due to disturbance. As the core used for the autofocus control, the small core section 41B or 41E, which is placed at a center part in the longitudinal direction of the core section 39 of the waveguide unit passing the laser for modification, is desirable.

Figure 6:
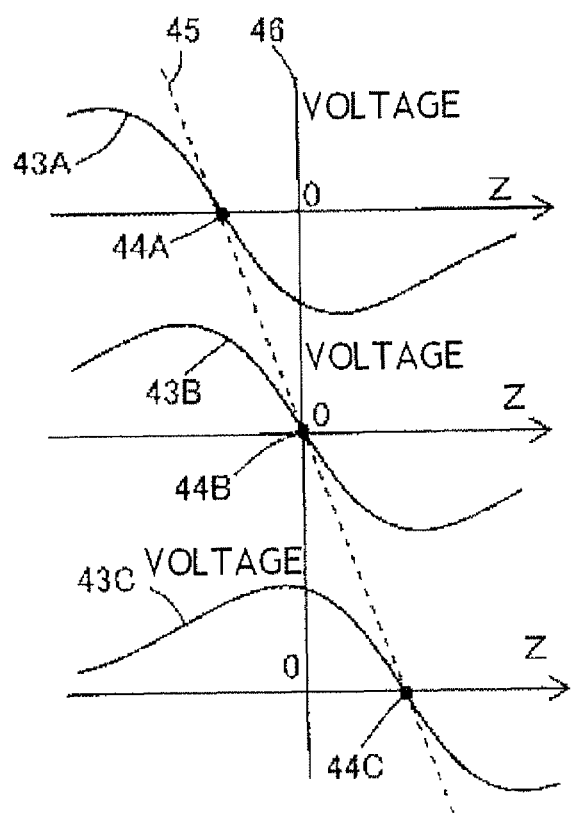
FIG. 6 illustrates a relationship between a focus error signal and a surface inclination of an object.

FIG. 6 illustrates a relationship between a voltage of a focus error signal and an inclination of the object surface. As for the focus error signals 43A to 43C generated by the laser light output from the small core sections 41A to 41C when the object surface 26 is not on a surface orthogonal to the optical axis 36A, particularly when the object surface 26 is inclined in the longitudinal direction (X direction) of the laser spot 27, the focus error signal (voltage) 43B generated by the core section 41B at the middle part in FIG. 6 is zero, whereas the focus error signal (voltage) 43A generated by the core section 41A at the upper part in FIG. 6 is minus, and the focus error signal (voltage) 43C generated by the core section 41C at the lower part in FIG. 6 is plus, as clearly seen in FIG. 6. Accordingly, focusing positions 44A, 44B, and 44C of the laser spot are detected in a relatively shifting state with respect to the Z axis.

As described in FIG. 3, the laser spot to modify the object has a long shape in the X direction (corresponding to the shape of the common clad section 38), and the change of width in the laser spot lateral direction (Y direction) can be detected, by detecting focus deviations of both ends of the laser spot. In the present exemplary embodiment, an example using the focus error signals 43A to 43C generated by the laser light output from the small core sections 41A to 41C is described. However, the similar focus error signals can be obtained by using the small core sections 41D to 41F. Further, an inclination in the Y direction of the object can be also detected by detecting and comparing focus error signals from a pair of the small core sections opposing to each other in the Y direction.

Generally, modifying of an object is carried out by scanning the laser spot formed on the object surface in the Y direction. For stably and uniformly modifying the object, it is desired that the laser spot is formed in a rectangular shape on the object surface, and a laser spot width in the scanning direction is fixed. The semiconductor manufacturing apparatus according to the present exemplary embodiment, in a process to adjust the initial inclination of the object, can accurately correct the inclination by adjusting while detecting the focus signals at the above-described laser spot both ends. For example, the present apparatus can correct the inclination at a time of initial adjustment, by adjusting the inclination so as to make a focusing line 45 (a dotted line), which is illustrated in FIG. 6, agree with a parallel line 46.

Further, the apparatus according to the present exemplary embodiment can detect and correct a focus deviation during a modifying operation in real time, by monitoring the focus error signals (e.g., signals 43A and 43C) at the laser spot both ends during the modifying operation.

Furthermore, in the apparatus according to the present exemplary embodiment, it is possible to stabilize the focus control during the modifying operation. A ground of this will be described in detail below. A reflection ratio of an object is generally changed before and after modification, and the change of the reflection ratio deteriorates the stability of the focus control. For avoiding the change of the reflection ratio, it is predetermined whether reflection light before modification is selected as the autofocus signal or a reflection ratio after modification is selected. Then, according to the scanning direction of the modifying laser spot 27, advance focus spots (e.g., the laser spots irradiated by the small core sections 41A, 41B and 41C) of the modifying laser spot 27 or succeeding focus spots (e.g., the laser spots irradiated by the small core sections 41D, 41E and 41F) are selected, where the advance focus spots are irradiated in advance by the scanning, and the succeeding focus spots are irradiated later than the advance focus spots by the scanning. Then, the selected focus spots are used as focus error signals. By this processing, a constantly stabilized return light amount can be obtained, and stable focus signals can be obtained. As a result, the autofocus control can be stabilized. In addition, similar focus error signals generated by the modifying laser spot can be also used for the autofocus control. However, since the focus error signal generated by the modifying laser spot during the modification is easily disordered, it is preferable that the focus error signal generated by the other laser spot is used for the autofocus control, as described above.

Further, in the above-described exemplary embodiment, an example where the six small core sections passing the laser light are arranged around the core section of the optical waveguide unit passing the laser light for modifying an object is described. However, the number of the small core sections is not limited to six, and any number of the small core sections can be used. The number and arrangement position of the small core sections can be determined according to necessity. Further, in the present apparatus, the laser light can pass through only core sections at required positions, without passing the laser light through all of the six small core sections. Further, the present apparatus is not limited to a case that the laser light having the same wavelength pass through all of the six small core sections, but laser light having different laser wavelengths can pass through the respective small core sections. Furthermore, the shapes of the six small core sections are not limited to the rectangular shape, and can be, for example, a circular or elongated elliptical shape. In this case, it is preferable that the main core section of the optical waveguide unit has an elongated elliptical cross sectional shape having a lateral width of 1 μm to 20 μm and a longitudinal width of 1 mm to 60 mm.

Furthermore, in the above-described exemplary embodiment, an example where core sizes and core positions are the same at the input end surface and the output end surface is described. However, the present invention is not limited to this example, and there can be a difference between them. For example, the core sizes can be larger and distances between the cores can be larger on the input end surface side. Any core sizes and core distances can be used if they are desirable at the output end surface.

Application Example

Figure 7:
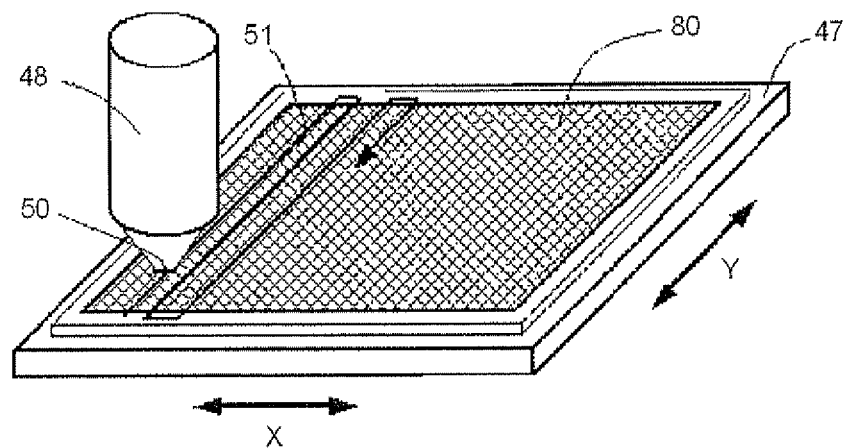
FIG. 7 illustrates an operation of a semiconductor manufacturing apparatus according to the present exemplary embodiment.

Then, a method for modifying amorphous silicon formed on glass substrate of a liquid crystal display to polysilicon by using the semiconductor manufacturing apparatus according to the present exemplary embodiments will be described with reference to FIG. 7.

In the modification method, first, an insulating substrate 80 on which a silicon film is formed is loaded on an X-Y stage 47 which is movable for positioning at an arbitrary position in the X direction and the Y direction at an arbitrary speed. Then, laser light is irradiated by using the semiconductor manufacturing apparatus 48 of anyone of the above-described exemplary embodiments. While moving the X-Y stage 47 so as to scan the linear laser spot 50 in the lateral direction of the linear laser spot 50 at a predetermined speed, the linear laser spot 50 is output on the silicon film surface, to thereby modify the silicon film on the insulating substrate 80.

In the present example, the linear laser spot 50 is scanned in the direction of an arrow 51 by moving the insulating substrate 80 side on which the silicon film is formed. However, the present invention is not limited to this example. The linear laser spot 50 can be relatively scanned by moving the semiconductor manufacturing apparatus 48 side in the X direction and the Y direction. In this case, the semiconductor manufacturing apparatus 40 in FIG. 1 or 5, can be used in such a manner that the laser light source is independently fixed and placed at a distant place, laser light is transmitted to the core section of the present semiconductor manufacturing apparatus from the laser light source by using a optical fiber, and then only the present semiconductor manufacturing apparatus can be moved. This example can be realized easily because the optical fiber has flexibility in general. Furthermore, in the present invention, both of the semiconductor manufacturing apparatus (laser irradiation apparatus) 48 and the insulating substrate 80 on which the silicon film is formed can be moved to relatively scan the linear laser spot 50.

Figure 8A:
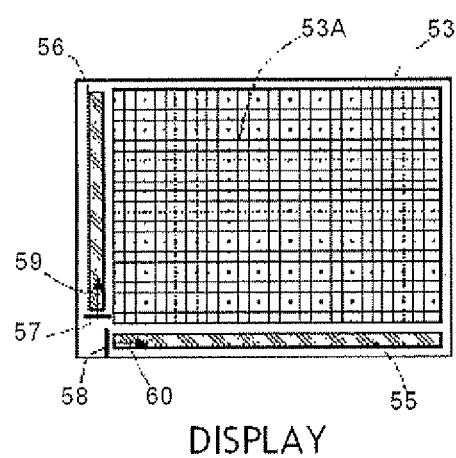
FIGS. 8(a) and 8(b) illustrate a relationship between a display and a laser scanning position.
Figure 8B:
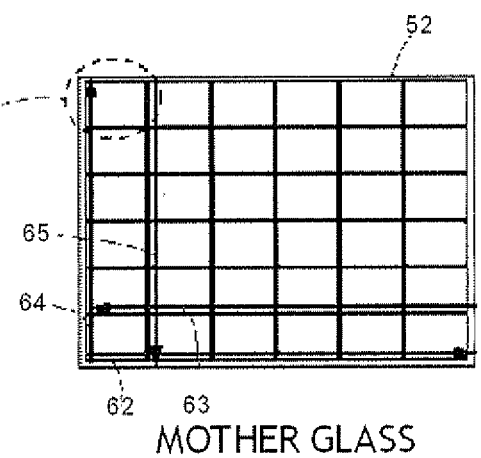

FIGS. 8(a) and 8(b) illustrate a relationship between a liquid crystal display 53 and a laser scanning position to a mother glass 52. FIG. 8(a) illustrates a whole configuration of the display 53, and FIG. 8(b) illustrates the mother glass. In the mother glass 52, a plurality of the displays 53 are formed. The display 53 which is an object of the present exemplary embodiment is configured with many pixel sections 53A for displaying an image on one display 53, a X driver circuit 55 for driving (liquid crystal) pixels in the X direction, and a Y driver circuit 56 for driving (liquid crystal) pixels in the Y direction. The X driver circuit 55 and the Y driver circuit 56 need to be configured with a high performance TFT in a liquid crystal display apparatus as above-described, and require polysilicon having high quality.

The laser irradiation apparatus and the laser irradiation method according to the present exemplary embodiments are to modify silicon of the above-described X driver circuit 55 and the Y driver circuit 56. First, linear laser spots 57 and 58 are adjusted to be at positions to form the X driver circuit 55 and the Y driver circuit 56. Then, the semiconductor manufacturing apparatus makes scanning in the directions of arrows 59 and 60, while irradiating the laser spots, and thereby operates to perform modification of the driver circuits. In addition, the scanning can be divided into several times according to necessity with respect to one driver circuit forming section in the present exemplary embodiment. It is preferable that silicon modification treatment is performed by scanning the linear laser spot in the directions of arrows 62 to 65 on the mother glass 52 before cutting out the display 53.

Figure 9:
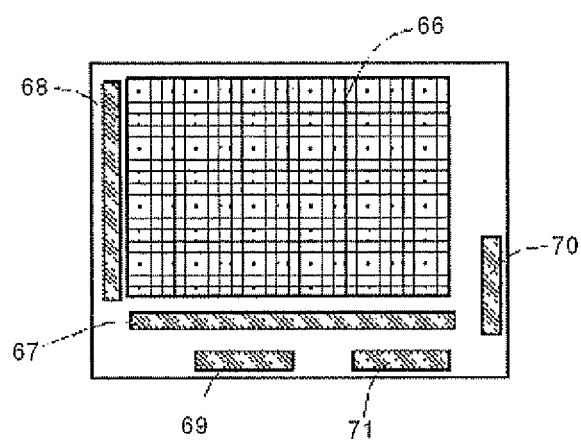
FIG. 9 illustrates a system-on-glass display.
Figure 10:
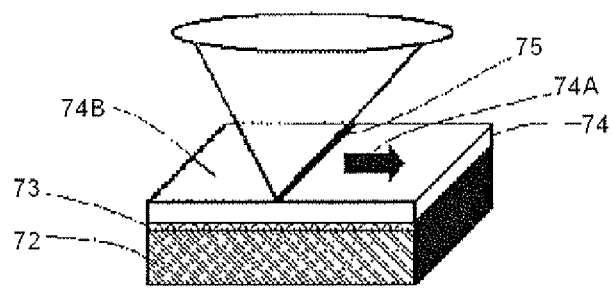
FIG. 10 illustrates a general configuration on a substrates and general modification of a silicon film by laser irradiation.

FIG. 9 illustrates a system-on-glass display. In addition to the X driver circuit 67 and the Y driver circuit 68, the system-on-glass display includes high functional integrated circuits such as a control circuit 69, an interface circuit 70, a memory circuit (not illustrated), and an arithmetic circuit 71, and they are formed with a similar configuration and by a similar method to FIG. 9. Of course, the high functional circuits require polysilicon having high quality. The high quality polysilicon is formed by using a similar method to the silicon modification method of the X driver circuit and the Y driver circuit, which is above-described with reference to FIG. 7.

In addition, in the above-described exemplary embodiments, quartz glass and alkali-free glass are used as the insulating substrate. However, the present invention is not limited to this example, and a plastic substrate or a flexible plastic sheet can be used. Further, in the exemplary embodiment, the liquid crystal display is used as an object to be modified. However, the object of the present invention is not limited to the liquid crystal display, and an organic electroluminescence display can be applied.

As described above, the semiconductor manufacturing apparatus according to the present exemplary embodiments can realize a rectangular laser spot having predetermined size, a comparatively high laser power density, and a laser strength distribution in a top-flat shape on a surface of an object, with a comparatively simplified configuration and arrangement, and can modify the surface of the object by such the laser spot.

Furthermore, in the present exemplary embodiments, the semiconductor manufacturing apparatus can scan the linear laser spot at a desired position on the mother glass, at the desired scanning speed, in the desired direction, and with a desired laser output. Thus, a silicon film with high quality can be obtained at a comparatively low cost.

What is claimed is:

1. A semiconductor manufacturing apparatus comprising:
a laser light source for light-emitting laser light;
a control unit for controlling laser power of the laser light source;
an optical waveguide unit including a core section for transmitting the laser light and a clad section for covering the core section; and
a lens for forming the laser light output from an output end surface of the optical waveguide unit into a laser spot having a predetermined shape,
wherein the optical waveguide unit guides the laser light to the output end surface from an input end surface by a difference in refractive index between the core section and the clad section, irradiates an object with the laser spot formed by the lens, and thereby modifies the surface of the object,
wherein the optical waveguide unit has, on the output end surface, the core section having a rectangular cross sectional shape whose one side has a length of 1 mm to 20 mm and other side orthogonal to the one side has a length of 1 mm to 60 mm, and
wherein the control unit sets a value of the laser power of the laser light source so that a power density of the laser spot output from the output end surface of the core section is 0.1 mW/mm$^2$ or more.

2. A semiconductor manufacturing apparatus comprising:
a laser light source for light-emitting laser light;
a control unit for controlling laser power of the laser light source;
an optical waveguide unit including a core section for transmitting the laser light and a clad section for covering the core section; and
a lens for forming the laser light output from an output end surface of the optical waveguide unit into a laser spot having a predetermined shape,
wherein the optical waveguide unit guides the laser light to the output end surface from an input end surface by a difference in refractive index between the core section and the clad section, irradiates an object with the laser spot formed by the lens, and thereby modify the surface of the object,
wherein the optical waveguide unit has, on the output end surface, the core section having an elongated elliptical cross sectional shape whose lateral width is 1 mm to 20 mm and longitudinal width is 1 mm to 60 mm, and
wherein the control unit sets a value of the laser power of the laser light source so that a power density of the laser spot output from the output end surface of the core section 0.1 mW/mm$^2$ or more.

3. The semiconductor manufacturing apparatus as claimed in claim 1,
wherein a PV ratio calculated by a formula of (P−V)/P'100% is 20% or less, where P is a maximum value of a strength distribution of the laser spot output from the output end surface of the core section, and V is a minimum value of the strength distribution.

4. The semiconductor manufacturing apparatus as claimed in claim 2,
wherein a variable aperture for narrowing a width of the laser light output from the output end surface is provided between the output end surface of the optical waveguide unit and the lens.

5. The semiconductor manufacturing apparatus as claimed in claim 4,
wherein a PV ratio calculated by a formula of (P−V)/P100% is 20% or less, where P is a maximum value of a strength distribution of the laser spot output from the output end surface of the core section, and Visa minimum value of the strength distribution.

6. A semiconductor manufacturing apparatus comprising:
a laser light source for light-emitting laser light;
a control unit for controlling laser power of the laser light source;
an optical waveguide unit including a plurality of core sections for transmitting the laser light and a clad section for covering the core sections;
a lens for forming the laser light output from an output end surface of the optical waveguide unit into a laser spot having a predetermined shape; and
a focus controlling unit for controlling a focus of the laser spot,
wherein the optical waveguide unit guides the laser light to the output end surface from an input end surface by a difference in refractive index between the core sections and the clad section, and irradiates an object with the laser spot formed by the lens, while focus-controlling the laser spot, and thereby modifies the surface of the object,
wherein the optical waveguide unit has, on the output end surface, a main core section having a rectangular cross sectional shape whose one side has a length of 1 mm to 20 mm and other side orthogonal to the one side has a length of 1 mm to 60 mm, and a plurality of sub-core sections arranged around the main core section to output laser light for controlling a focus, wherein the control unit sets a value of the laser power of the laser light source so that a power density of the laser spot output from the main core section is 0.1 mW/mm$^2$ or more, and wherein the focus control unit controls the focus based on reflection light of the laser light output from the sub-core sections.

7. A semiconductor manufacturing apparatus comprising:

a laser light source for light-emitting laser light;

a control unit for controlling laser power of the laser light source;

an optical waveguide unit including a plurality of core sections for transmitting the laser light and a clad section for covering the core sections;

a lens for forming the laser light output from an output end surface of the optical waveguide unit into a laser spot having a predetermined shape; and a focus controlling unit for controlling a focus of the laser spot, wherein the optical waveguide unit guides the laser light to the output end surface from an input end surface by a difference in refractive index between the core sections and the clad section, and irradiates an object with the laser spot formed by the lens, while focus-controlling the laser spot, and thereby modifies the surface of the object, wherein the optical waveguide unit has, on the output end surface, a main core section having an elongated elliptical cross sectional shape whose lateral width is 1 mm to 20 mm and longitudinal width is 1 mm to 60 mm, and plurality of sub-core sections arranged around the main core section to output laser light for controlling a focus, wherein the control unit sets a value of the laser power of the laser light source so that a power density of the laser spot output from the main core section is 0.1 mW/mm$^2$ or more, and wherein the focus control unit controls the focus based on reflection light of the laser light output from the sub-core sections.

8. The semiconductor manufacturing apparatus as claimed in claim 6, wherein a PV ratio calculated by a formula of (P−V)/P'100% is 20% or less, where P is a maximum value of a strength distribution of the laser spot output from the output end surface of the main core section and V is a minimum value of the strength distribution.

9. The semiconductor manufacturing apparatus as claimed in claim 7, wherein a variable aperture for narrowing a width of the laser light output from the output end surface is provided between the output end surface of the optical waveguide unit and the lens.

10. The semiconductor manufacturing apparatus as claimed in claim 8, wherein a variable aperture for narrowing a width of the laser light output from the output end surface is provided between the output end surface of the optical waveguide unit and the lens.

11. The semiconductor manufacturing apparatus as claimed in claim 6, wherein the focus control unit controls the focus so that reflected laser spots of the sub-core sections projected by reflection light of the laser light output from the sub-core sections have a predetermined size.

12. The semiconductor manufacturing apparatus as claimed in claim 8, wherein the focus control unit controls the focus so that reflected laser spots of the sub-core sections projected by reflection light of the laser light output from the sub-core sections have a predetermined size.

13. The semiconductor manufacturing apparatus as claimed in claim 9, wherein the focus control unit controls the focus so that reflected laser spots of the sub-core sections projected by reflection light of the laser light output from the sub-core sections have a predetermined size.

14. The semiconductor manufacturing apparatus as claimed in claim 10, wherein the focus control unit controls the focus so that reflected laser spots of the sub-core sections projected by reflection light of the laser light output from the sub-core sections have a predetermined size.

* * * * *